US008366370B2

(12) United States Patent
Nakamura et al.

(10) Patent No.: US 8,366,370 B2
(45) Date of Patent: Feb. 5, 2013

(54) VACUUM PROCESSING APPARATUS

(75) Inventors: Tsutomu Nakamura, Hikari (JP);
Hidenobu Tanimura, Kudamatsu (JP);
Yuya Mizobe, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 121 days.

(21) Appl. No.: 12/712,834

(22) Filed: Feb. 25, 2010

(65) Prior Publication Data

US 2011/0176893 A1 Jul. 21, 2011

(30) Foreign Application Priority Data

Jan. 20, 2010 (JP) ................................. 2010-009615

(51) Int. Cl.
*H01L 21/677* (2006.01)

(52) U.S. Cl. ........................................ 414/217; 414/939

(58) Field of Classification Search .............. 414/217, 414/217.1, 1, 146, 219, 939, 940
See application file for complete search history.

(56) References Cited

U.S. PATENT DOCUMENTS

| | | | | |
|---|---|---|---|---|
| 5,848,933 A * | 12/1998 | Roberson et al. | ............. | 454/187 |
| 6,186,723 B1 * | 2/2001 | Murata et al. | ................. | 414/217 |
| 6,396,072 B1 * | 5/2002 | Meyhofer et al. | ........... | 250/559.4 |
| 6,656,028 B2 * | 12/2003 | Chokshi et al. | ................ | 451/339 |
| 6,866,460 B2 * | 3/2005 | Davis et al. | ..................... | 414/217 |
| 7,581,916 B2 * | 9/2009 | Miller | ............................ | 414/217 |
| 7,789,609 B2 * | 9/2010 | Okabe et al. | ................... | 414/217 |
| 2008/0001113 A1 * | 1/2008 | Kim et al. | ..................... | 251/303 |
| 2008/0014056 A1 * | 1/2008 | Miller | .......................... | 414/217 |

FOREIGN PATENT DOCUMENTS

JP     2005-101598     4/2005

* cited by examiner

*Primary Examiner* — Saul Rodriguez
*Assistant Examiner* — Glenn Myers
(74) *Attorney, Agent, or Firm* — Antonelli, Terry, Stout & Kraus, LLP.

(57) ABSTRACT

A vacuum processing apparatus includes a transfer container for transferring a wafer in the internal space thereof reduced in pressure, a vacuum vessel coupled to the side wall of the vacuum vessel and including a processing chamber having a sample stage therein on which a wafer to be processed is mounted, a lid member opened or closed by rotation above the vacuum vessel, an inner chamber member arranged in the vacuum vessel and making up the inner wall of the processing chamber, and a jig coupled to the side wall of the vacuum vessel to lift and hold the inner chamber member by being coupled thereto. The jig includes a first joint portion having vertical and horizontal shafts, an extensible arm portion rotatable around each shaft of the first joint portion, and a second joint portion with the inner chamber member adapted to rotate around the horizontal axis thereof.

3 Claims, 9 Drawing Sheets

VACUUM PROCESSING APPARATUS

BACKGROUND OF THE INVENTION

This invention relates to a vacuum processing apparatus for processing a substrate-like sample such as a semiconductor wafer in a processing chamber arranged in a vacuum vessel, or in particular, to a vacuum processing apparatus having a jig for retrieving the members of the processing chamber from the vacuum vessel.

Each vacuum processing apparatus for processing a semiconductor wafer to manufacture a semiconductor device is required to occupy a smaller area to increase the number thereof installed in a building like a cleaning room in which a production line is installed. For this reason, efforts are made to reduce the apparatus size, which in turn makes it necessary to reduce the space for maintenance and inspection of the apparatus as far as possible.

With the increase in the size of the semiconductor wafer, on the other hand, the parts in the vacuum vessel making up the processing apparatus, or especially, the parts of the processing chamber have also increased in size and weight. Handling these parts for apparatus maintenance and inspection, therefore, takes both labor and time to a greater degree. As a result, what is called the downtime during which the apparatus is out of operation or no wafer is processed is lengthened, thereby adversely affecting the operating efficiency of the apparatus as a whole.

The maintenance and inspection work is conducted to suppress the adverse effect on the wafer which otherwise might occur due to the deposition of products in the processing chamber or the change in the inner surface state of the processing chamber caused by the increased number of samples such as wafers processed by the apparatus. Otherwise, the problem would be posed that the products are deposited on the surface of the parts arranged in the processing chamber of the apparatus, and the resulting deterioration of the parts causes the products from being separated or dropped off in the form of minuscule particles from the surface of the parts. The products thus released again in the processing chamber are deposited again as contaminating matter on the wafer and contaminate the wafer.

In order to suppress this inconvenience, the parts in the processing chamber are periodically replaced and the substances or deposits forming the contaminating matter are cleaned or removed to regenerate the surface. During this work, the interior of the processing chamber is exposed to the atmospheric pressure and the wafer cannot be processed. This suspension of operation reduces the processing efficiency. Thus, an improved maintenance and inspection work is desired.

An example of the conventional technique for removing and replacing the internal parts of the vacuum processing apparatus is disclosed in JP-A-2005-101598.

SUMMARY OF THE INVENTION

The related art described above, however, poses the problem as it fails to take the following points into sufficient consideration.

Specifically, in the vacuum processing apparatus, the maintenance and inspection work is conducted in a limited space and the downtime during which the operation stops is required to be reduced. In this work, the interior of the processing chamber is open to the atmosphere and, therefore, water is liable to be adsorbed to the surface of the internal parts of the processing chamber. Thus, the time during which the interior is open to the atmospheric is required to be shortened to suppress the water adsorption. Also, the maintenance work is required not to damage or form a dent on the surface of the internal parts of the processing chamber. The related art described above fails to take this problem into consideration.

Further, the parts arranged in the processing chamber of the vacuum processing apparatus have been mainly formed of a specified material such as aluminum. In recent years, however, the stainless steel material electropolished has come to be employed to reduce CoC (cost of consumer) and thus lengthen the service life of the parts. The resulting change in the material of the parts has substantially tripled the weight thereof, thereby making it sometimes unavoidable for a plurality of workers to conduct the work for replacing the parts in a limited space. This reduces the work efficiency and the resultant lengthened downtime leads to a lower processing efficiency.

This problem is not sufficiently taken into consideration in the related art as described above. The object of this invention is provide a vacuum processing apparatus in which the downtime is shortened and the production efficiency improved.

In order to achieve this object, according to one aspect of the invention, there is provided a vacuum processing apparatus comprising a transfer container for transferring a subject wafer in a low-pressure internal space and a vacuum vessel including a processing chamber having a sample stage coupled to the side wall of the transfer and having arranged therein a wafer to be processed, a lid member opened or closed by rotating around a hinge portion arranged at an end of the vacuum vessel nearer to the transfer container above the vacuum vessel, an inner chamber member arranged in and coupled to the side wall of the vacuum vessel and making up the inner wall of the processing chamber, and a jig arranged on the side wall of the vacuum vessel to couple and hold by lifting the inner chamber member, wherein the jig includes a first joint portion having vertical and horizontal shafts, an extensible arm unit rotated around each shaft of the first joint portion, and a second joint portion arranged at the forward end of the arm unit and having a horizontal axis around which the inner chamber member is rotatable.

According to another aspect of the invention, there is provided a vacuum processing apparatus, wherein the inner chamber member is configured of a plurality of member units arranged above and under the sample stage, and wherein after the sample stage is lifted and retrieved toward the transfer container from inside the vacuum vessel, the member unit of the inner chamber member arranged under the sample stage is coupled to the jig and retrievable from the vacuum vessel by rotating the arm portion around the first joint portion.

According to still another aspect of the invention, there is provided a vacuum processing apparatus, wherein the transfer container is polygonal in plan view, a plurality of the adjacent vacuum vessels are coupled to the side wall of the transfer container having the adjacent sides of the polygon, and each of the vacuum vessels has a jig on the side wall thereof.

According to yet another aspect of the invention, there is provided a vacuum processing apparatus, wherein the adjacent vacuum vessels form a space therebetween where the worker can stand and conduct the work of coupling the inner chamber member and the jig to each other.

Other objects, features and advantages of the invention will become apparent from the following description of the embodiments of the invention taken in conjunction with the accompanying drawings.

DETAILED DESCRIPTION OF THE INVENTION

Embodiments of the invention are explained in detail below with reference to the drawings.

[Embodiments]

With reference to FIGS. 1 to 10, embodiments of the invention are described in detail.

Figure 1:
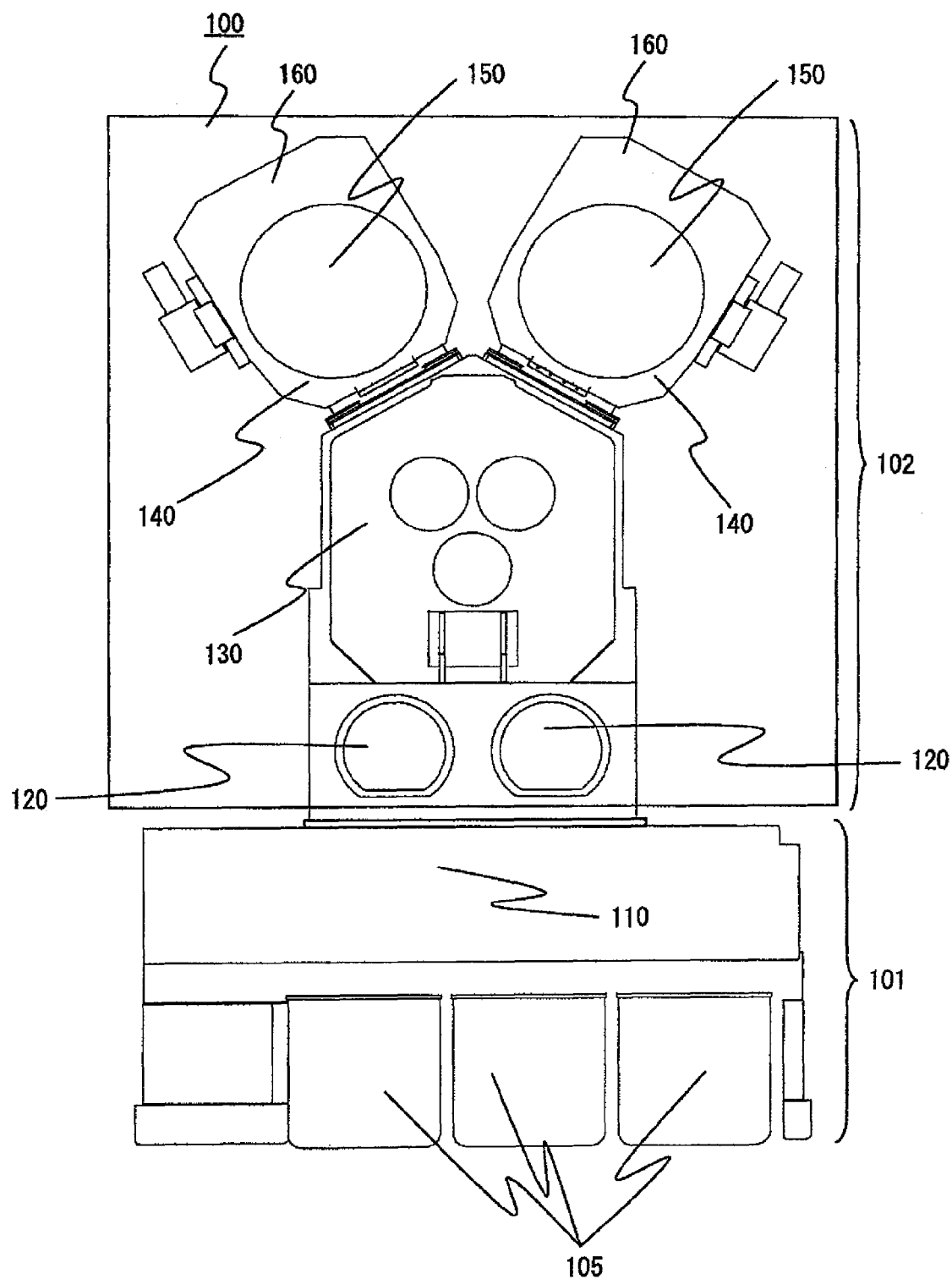
FIG. 1 is a top plan view for explaining a general configuration of a vacuum processing apparatus according to an embodiment of the invention.

FIG. 1 is a top plan view schematically showing the configuration of the vacuum processing apparatus according to this invention. The vacuum processing apparatus 100 shown in FIG. 1 is roughly divided into two sections in longitudinal direction. The upper section of FIG. 1 represents the rear side, and the lower section thereof the front side of the vacuum processing apparatus 100. An atmospheric processing section 101 is arranged on the front side and a vacuum processing section 102 coupled to the back of the atmospheric processing section 101 is arranged on the rear side of the vacuum processing apparatus 100.

The front side of the atmospheric processing section 101 faces a path of a building such as a clean room installed with the vacuum processing apparatus 100. This path is for transferring a cassette accommodating therein a sample on a substrate such as a semiconductor wafer to be processed.

The atmospheric processing section 101 includes an atmospheric transfer chamber 110 set to substantially the same internal pressure as the atmospheric pressure to transfer the sample in the cassette and a plurality of cassette rests 105 each having a cassette mounted thereon. The cassette rests 105 are arranged in parallel to each other on the front side of the substantially parallelopipedal atmospheric transfer chamber 110. An atmospheric robot for delivering in and out the wafer in the cassette is arranged in the atmospheric transfer chamber 110, and the wafer is transferred between the cassette and a plurality of lock chambers 120 arranged on the back of the atmospheric transfer chamber 110.

The vacuum processing section 102 is coupled to the back of the atmospheric transfer chamber 110, and the wafer is transferred inside the vacuum processing section 102 decompressed to a predetermined vacuum degree. The vacuum processing section 102 includes the plurality of the lock chambers 120 coupled to the back of the atmospheric transfer chamber 110 and internally communicable with each other, a vacuum transfer chamber 130 coupled to the back of the lock chambers 120 and having the decompressed interior in which the wafer is transferred, and a plurality of vacuum processing units 160 coupled to the rear side wall of the vacuum transfer chamber 130.

The vacuum processing units 160 each have an internally decompressed vacuum vessel and a processing chamber 150 in which the wafer is arranged and processed. According to this embodiment, the vacuum vessel of each vacuum processing unit 160 has a plurality of space sections in which an auxiliary vacuum chamber 140 and the vacuum container 150 are arranged. The wafer is transferred onto the upper surface of a sample stage, not shown, arranged in each vacuum container 150. After that, the interior of each vacuum container 150 is hermetically sealed and maintained at a predetermined pressure by closing a gate valve operated to open/close the interior of the vacuum container 150. Under this condition, a gas and an electric or magnetic field are supplied into the vacuum container 150, and using a plasma thus formed, the wafer is etched or otherwise processed.

The lock chambers 120 are arranged between and coupled to the atmospheric transfer chamber 110 and the vacuum transfer chamber 130. The interiors of these chambers are adapted to communicate with each other or can be closed by operating a gate valve arranged between them. Further, in order to transfer the wafer from the atmospheric transfer chamber 110 to the vacuum transfer chamber 130 or the other way around, the interior of each lock chamber 120 is configured to adjust the pressure between a predetermined vacuum degree in the vacuum transfer chamber 130 and the internal atmosphere of the atmospheric transfer chamber 110.

The vacuum transfer chamber 130 has an internal space in which the wafer is transferred between the lock chambers 120 and the vacuum processing units 160. This internal space has installed a vacuum robot therein, not shown, to hold and transfer the wafer under a reduced pressure. The vacuum robot exchanges the wafers between the sample tables, not shown, arranged in each of the lock chambers 120 and the vacuum processing units 160, respectively. According to this embodiment, the vacuum transfer chamber 130 is substantially polygonal (pentagonal) in plan view, and has, at the upper part thereof, a pentagonal lid openable to allow the worker to conduct the maintenance and inspection work. This lid is fixedly mounted on the vacuum transfer chamber 130 to keep the interior thereof hermetically sealed.

In the vacuum processing apparatus 100 according to this embodiment, the wafer, after being placed on the upper surface of any of the cassette rests 105 and accommodated in a cassette, is taken out of the cassette by the operation of an atmospheric robot in the atmospheric transfer chamber 110 and delivered into any of the lock chambers 120. In the process, the interior of the particular lock chamber 120 is set to a pressure equal to the atmospheric pressure by opening the gate valve operated between the lock chamber 120 and the atmospheric transfer chamber 110. Thus, the wafer is delivered in and mounted on the sample stage in the lock chamber 120 through an open gate.

After that, the interior of the lock chamber 120 is hermetically sealed and reduced in pressure to a level equal to the interior of the vacuum transfer chamber 130, after which the gate valve arranged between the lock chamber 120 and the vacuum transfer chamber 130 is opened, and the wafer is received by the vacuum robot from the sample stage in the lock chamber 120 and transferred inward of the target vacuum processing unit 160. The wafer is then delivered onto and held on the sample stage in the vacuum container 150 through the auxiliary vacuum chamber 140.

The interior of the vacuum container 150, after beings hermetically sealed and the wafer processed, again communicates with the auxiliary vacuum chamber 140 and the vacuum transfer chamber 130, and the wafer is taken out and transferred into any of the lock chambers 120 in the order reverse to the inward transfer. The interior of this lock chamber 120 is hermetically sealed, and after the pressure thereof is increased to the atmospheric pressure, the gate valve is opened in the reverse order to the aforementioned process. Thus, the wafer is delivered out from the upper surface of the sample stage in the lock chamber 120 into the original position in the original cassette.

Figure 2:
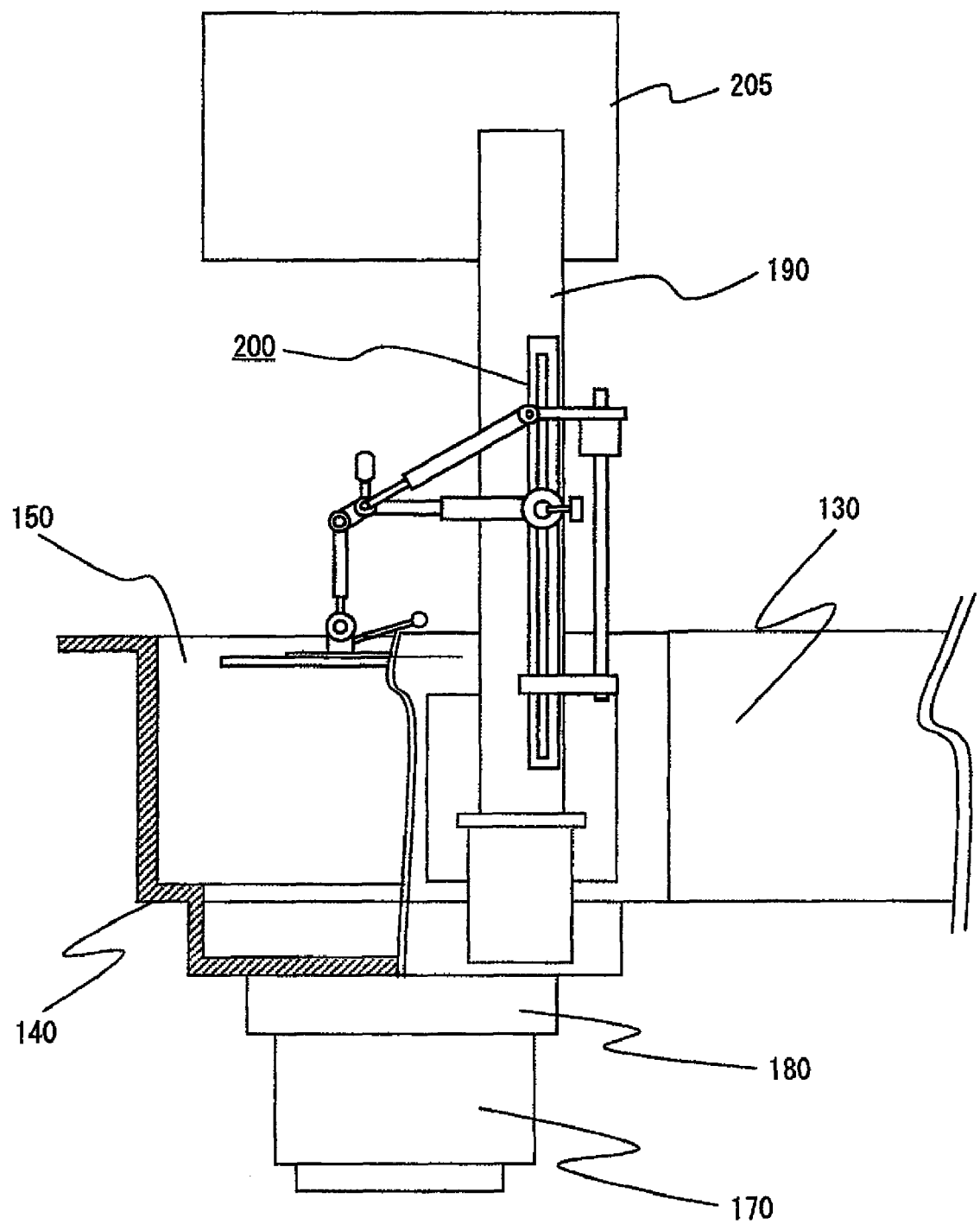
FIG. 2 is a schematic diagram for explaining a general configuration of a vacuum container and a maintenance jig according to the embodiment shown in FIG. 1.

FIG. 2 is a schematic diagram for explaining a general configuration of the vacuum processing unit 160 and the maintenance jig according to the embodiment shown in FIG. 1. In the vacuum processing unit 160 shown in FIG. 2, the side wall of the vacuum vessel thereof is coupled to the side wall of the vacuum vessel making up the vacuum transfer chamber 130 so that the interiors of the two vacuum vessels are communicable with each other. In FIG. 2, a part of the vacuum vessel of the unit 160 is shown as a longitudinal sectional view. Further, FIG. 2 shows, as a unit moved up, a power supply or a coil providing a means arranged above the vacuum processing unit 160 to form an electric or magnetic field.

The vacuum processing unit 160 includes an auxiliary vacuum chamber 140 configured by the vacuum vessel of the unit 160 with the side wall thereof coupled to the vacuum transfer chamber 130 and the vacuum container 150 arranged inside the auxiliary vacuum chamber 140. Also, under the vacuum vessel, there are arranged a high vacuum exhaust pump 170 communicating with the vacuum container 150 and a pressure adjusting mechanism 180 arranged between the high vacuum exhaust pump 170 and the exhaust opening under the vacuum container 150 to adjust the flow rate of the exhaust gas from the opening thereby to regulate the internal pressure of the vacuum container 150.

Above the vessel of the unit 160, there is arranged an electromagnetic field forming unit 205 providing a power supply or an electric field conduction mechanism for supplying the electric field into the vacuum container 150 or a magnetic field generating means such as a solenoid coil for supplying the magnetic field. The means for generating the electric or magnetic field is moved upward integrally to open the interior of the vacuum vessel of the unit 160 and secure a large maintenance space. As a result, a coil vertical moving unit 190 adapted to be moved along a vertical rail coupled to the electric and magnetic supply means described above is fixedly coupled to the side wall of the vacuum vessel of the vacuum processing unit 160 according to this embodiment.

At the time of conducting the maintenance work such as cleaning the interior or changing the internal parts of the auxiliary vacuum chamber 140 or the vacuum container 150, the worker moves up the electromagnetic field forming unit 205 by the coil vertical moving unit 190 and can perform the maintenance work with the lid of the vacuum vessel open. Also, according to this embodiment, a maintenance jig 200 is coupled to the side surface of the coil vertical moving unit 190. The maintenance jig 200 improves the maintainability of the internal parts of the vacuum vessel.

Figure 3:
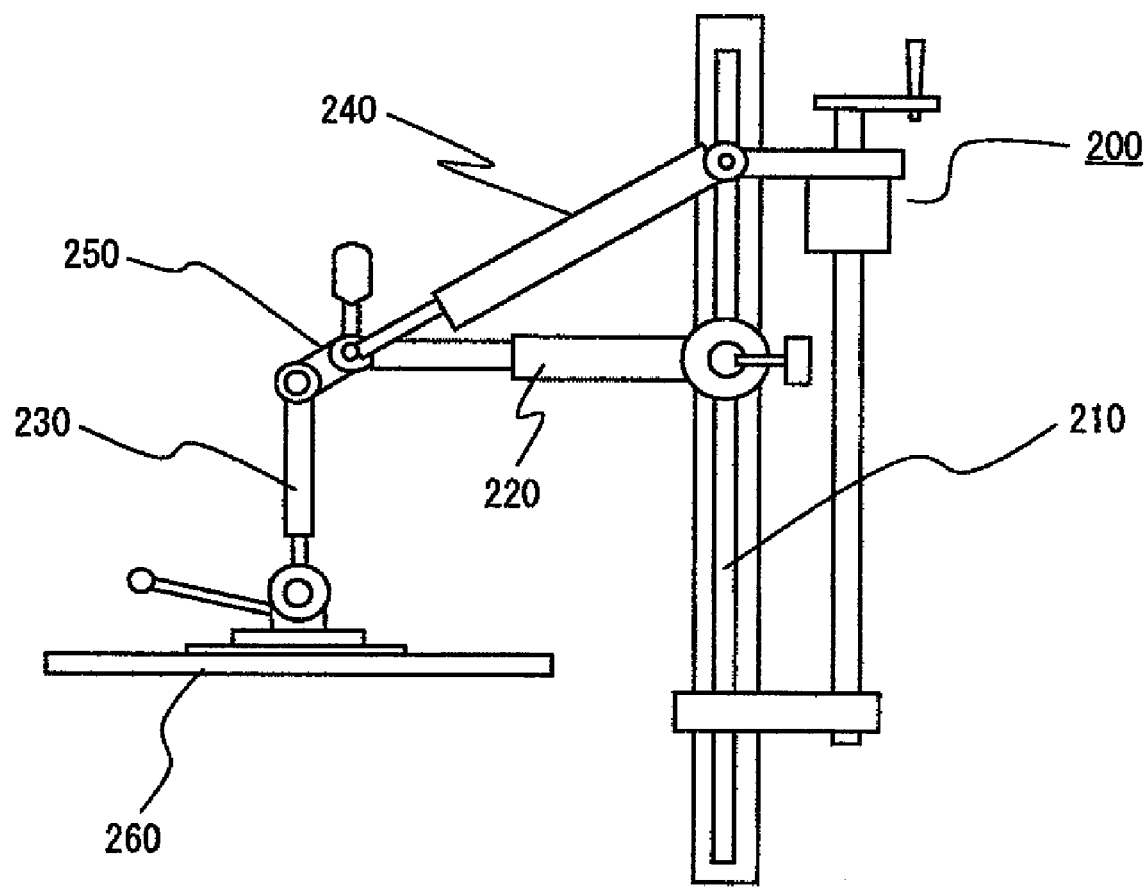
FIG. 3 is a side view for explaining the configuration of the maintenance jig of FIG. 2 in more detail.

FIG. 3 is a side view for explaining the configuration of the maintenance jig of FIG. 2 in more detail. The maintenance jig 200 is included in each vacuum processing unit 160.

The maintenance jig 200, arranged by being coupled to the side surface of the coil vertical moving unit 190, has a slide rail 210 along which an arm coupled thereto moves. The arm coupled to the slide rail 210 is connected with the parts to be replaced, inspected or cleaned. Therefore, the height of the arm is adjusted to the height of these parts by moving the arm along the slide rail 210.

The maintenance jig 200 includes a beam-like first joint arm unit 220 with a root-side end thereof coupled to the slide rail 210 and a beam-like second joint arm unit 230 coupled to the other end of the first joint arm unit 220. These parts are each configured to extend/contract along the axis of each beam to adjust the height of the forward end of the maintenance jig 200. In other words, the maintenance jig 200 is configured of a plurality of beam-like arm units to form a multijoint arm with the forward-end position thereof changeable.

In moving any part of the vacuum processing unit 160, the worker moves the maintenance jig 200, and after coupling the part to the forward end thereof, moves the maintenance jig 200 again. In the case where a part of the vacuum container 150 is lifted upward and retrieved from the vacuum vessel making up the auxiliary vacuum chamber 140, for example, the forward end of the maintenance jig 200 and the particular part are connected and coupled to each other by a fastening means such as a bolt, and by lifting up at least a portion of the multijoint arm, the forward end thereof is lifted upward thereby to move up and retrieve the part from the vacuum vessel.

In the process, the worker lifts the part together with the arm, and therefore, the total weight of the part and the arm is imposed as a load on the worker. The work efficiency is required to be improved by reducing this load. This embodiment includes, as the multijoint arm of the maintenance jig 200, a weight-reducing balancer 240 providing a beam-like arm unit arranged above the first joint arm unit 220, in which one end thereof is engaged and coupled with the slide rail 210 through a joint rotatable around a horizontal axis, while the other end of the beam-like arm unit is coupled through a joint rotatable around the horizontal axis of the other end of the first joint arm unit 220. Incidentally, the end of the balancer 240 nearer to the slide rail 210 is coupled with the slide rail 210 through a joint above the root-side end of the first joint arm unit 220.

The balancer 240 is a beam-like arm unit having a cylinder and a piston adapted to extend/contract by sliding inside cylinder. This piston is kept energized in such a direction as to shorten the arm unit length by an elastic member such as a spring or air or a means using the pressure difference of a fluid, so that the multijoint arm including the first joint arm unit 220 and the second joint arm unit 230 is energized in such a direction as to lift the forward end upward or shorten the whole length.

The multijoint arm of the maintenance jig 200 is rotated vertically in accordance with the extension and contraction of the balancer 240 or the first joint arm unit 220, and with this rotary operation, the joint of the balancer 240 or the first joint arm unit 220, as the case may be, rotates around a horizontal axis thereof. The energization of the balancer 240 in the direction of contraction always applies a force or a torque to rotate the multijoint arm upward. As a result, the load imposed by the weight of the multijoint arm and the parts coupled to the forward end is reduced.

Also, in order to fix the forward end of the multijoint arm or each arm unit at a predetermined height and position, a lever lock 250 is arranged on the joint nearer (the other end) of the balancer 240 and the first joint arm unit 220. The worker, by rotating the lever of the lever lock 250 and fastening the joint in the axial direction thereof, increases the resistance against the rotation thereof. By doing so, the worker can fix the multijoint arm at the proper interval, position or angle for maintenance of the parts for an improved working efficiency of maintenance and inspection. This lever lock 250 may alternatively be arranged on a plurality of joints coupling each arm unit of the multijoint arm. Also, the forward end of the second joint arm unit 230 is coupled with a jig head 260, which a part is mountable on or demountable from. This mounting or demounting job can be performed in one touch.

Figures 4A, 4B:
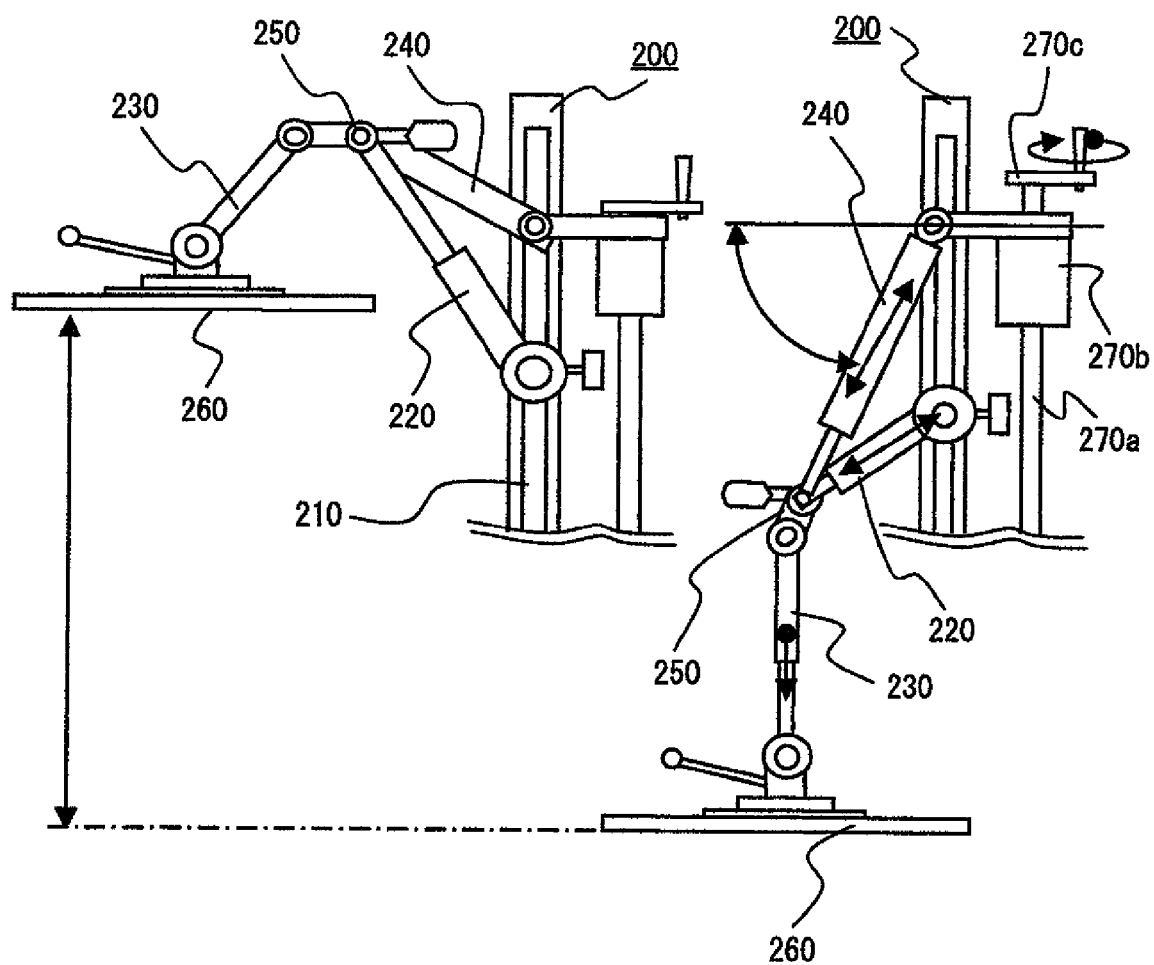
FIGS. 4A and 4B are side views showing the operation of the maintenance jig shown in FIG. 3.

FIGS. 4A and 4B are side views showing the operation of the maintenance jig shown in FIG. 3. In FIGS. 4A and 4B, the lower part of the slide rail 210 is not shown.

As described above, the multijoint arm of the maintenance jig 200 according to this embodiment rotates around a horizontal axis of a joint arranged near the root of the first joint arm unit or the balancer 240, so that the height of the jig head 260 located at the forward end thereof can be variably adjusted by moving the jig head 260 at the forward end vertically. Further, the rotational movement of the multijoint arm is accomplished by the extension/contraction of the balancer 240 or the first joint arm unit 220 and also by the extension/contraction of the second joint arm unit 230. Specifically, the magnitude (stroke) of vertical movement which determines the operation range of the multijoint arm is determined by the rotatable angle of the balancer 240 or the first joint arm unit 220 defined by the magnitude (stroke) of extension/contraction thereof and the magnitude of extension/contraction of the second joint arm unit 230. Further, the magnitude (stroke) can be determined also by the distance over which the joint near the root of the first joint arm unit 220 or the balancer 240 is movable along the slide rail 210 coupled thereto.

This operation range is determined in such a manner as to include a position where the jig head 260 can be retrieved with the internal parts of the vacuum vessel described later and coupled mountably. In order to achieve this operation range, the length and the extension/contraction stroke of the slide rail 210, the first joint arm unit 220, the second joint arm unit 230 and the balancer 240 and the size of the interval between the first joint arm unit 220 and the root-side joint (coupler) of the balancer 240 are determined. Incidentally, according to this embodiment, these joints are moved along the slide rail 210 in such a manner that the slide base 270b coupled to the root-side joint of the balancer 240 is moved along the cylindrical rod 270a arranged in parallel to the slide rail 210. The worker can accomplish this movement by rotating the slide handle 270c arranged at the upper end of the rod 270a, so that the slide base 270b coupled in mesh with the thread ridge formed on the cylindrical surface of the rod 270a is moved vertically thereby to vertically move the balancer 240 and the first joint arm unit 220 coupled with the slide base 270b.

Figure 5:
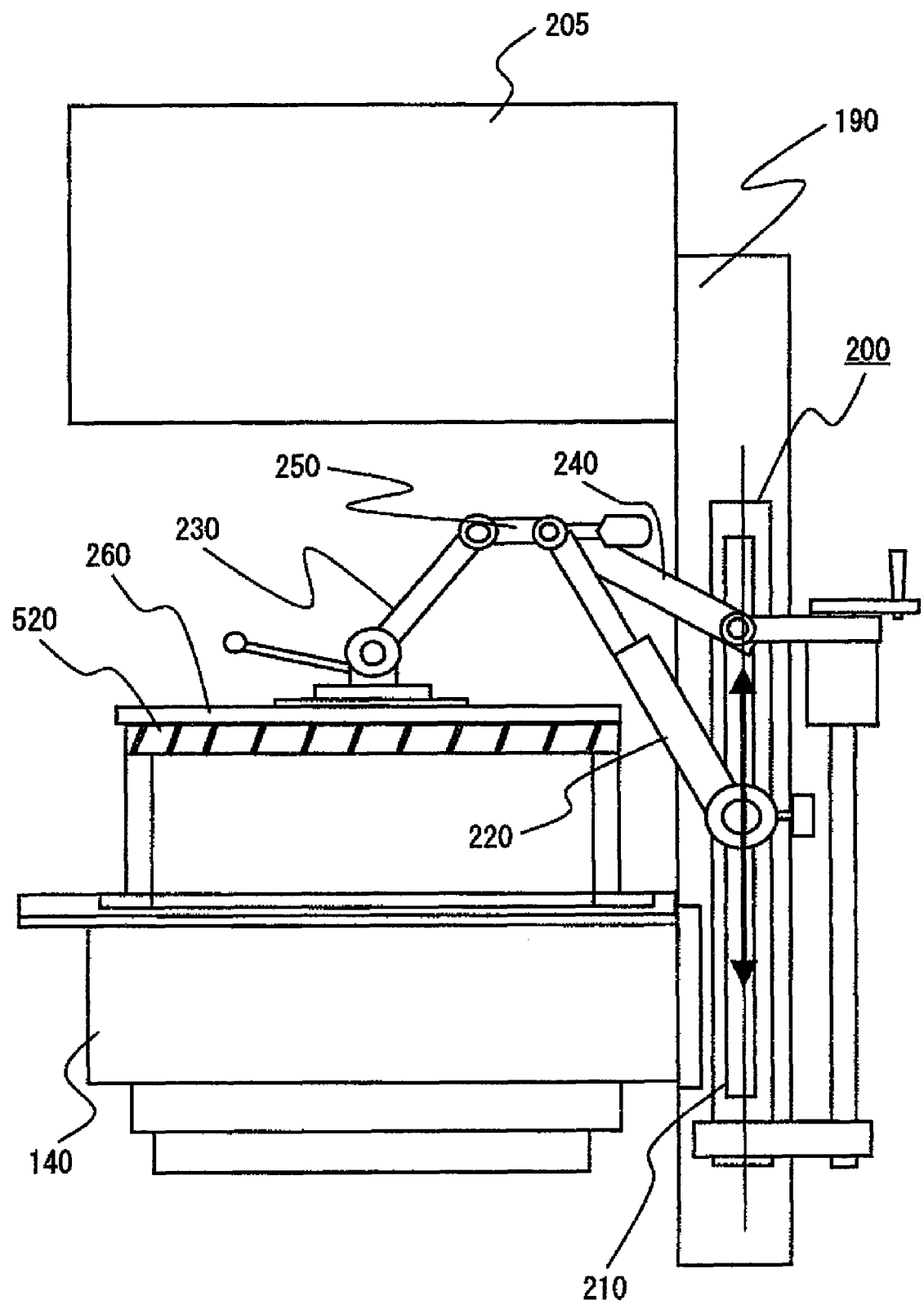
FIG. 5 is a schematic diagram showing the manner in which the parts forming the upper portion of the processing chamber are replaced according to the embodiment shown in FIG. 1.

FIG. 5 is a schematic diagram showing the manner in which the parts making up the upper portion of the processing chamber according to the embodiment shown in FIG. 1 are replaced. Especially, the manner shown in which the upper parts of the vacuum container 150 are replaced.

A case is shown in which, as the upper parts of the vacuum container 150, a discal quartz plate 510 making up the ceiling surface of the vacuum container 150, the cylindrical side wall in contact with the outer peripheral edge of the quartz plate 510 and an annular discharge block base 520 arranged under the cylindrical side wall are lifted for the purpose of the maintenance work. In view of the fact that each of these parts is as heavy as 25 to 30 kg for a considerably large total weight and that a sufficient space cannot be secured for the worker to conducted the work between the vacuum processing units 160 to change the parts, this maintenance work is conventionally carried out by two or three workers.

In the maintenance work on the vacuum processing unit 160 having the maintenance jig 200 according to this embodiment, in contrast, each part on which the maintenance work such as replacing, cleaning or inspecting a part is connected with the multijoint arm by bringing the jig head 260 into contact with or being coupled with the particular part. In the process, a part such as the quartz plate 510 is fixed on the lower surface of the jig head 260 by a one-touch clamp arranged between the forward end of the second joint arm unit 230 and the jig head 260. At the same time, the lever lock 250 arranged on the forward end-side joint of the first joint arm unit 220 and other joints is rotated and fastened to fix the angle of the joints of the multijoint arm between the arms units. After that, the second joint arm unit is contracted and lifted up by 30 mm along the direction of arrow in the upper part of FIG. 5. Then, the second joint arm unit 230 and the jig head 260 are revolved about the forward end side of the multijoint arm, or in this embodiment, in horizontal direction and moved into the maintenance area around the side wall of the vacuum processing unit 160. Then, the parts are cleaned, regenerated or replaced with the parts already cleaned or regenerated.

Figure 6:
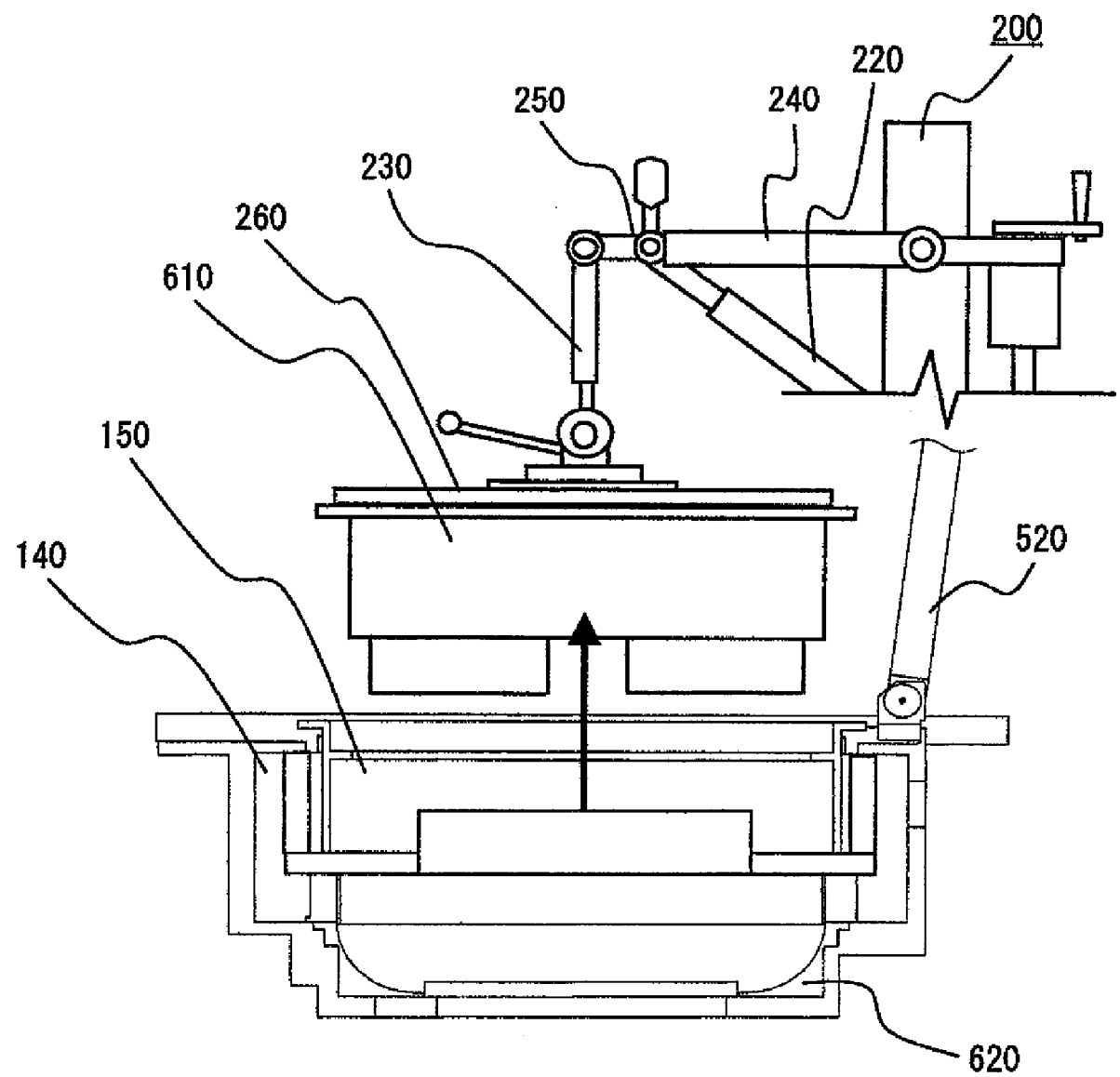
FIG. 6 is a longitudinal sectional view for explaining the operation of the maintenance jig to conduct the maintenance work on the internal parts of a vacuum vessel according to the embodiment shown in FIG. 1.
Figure 7:
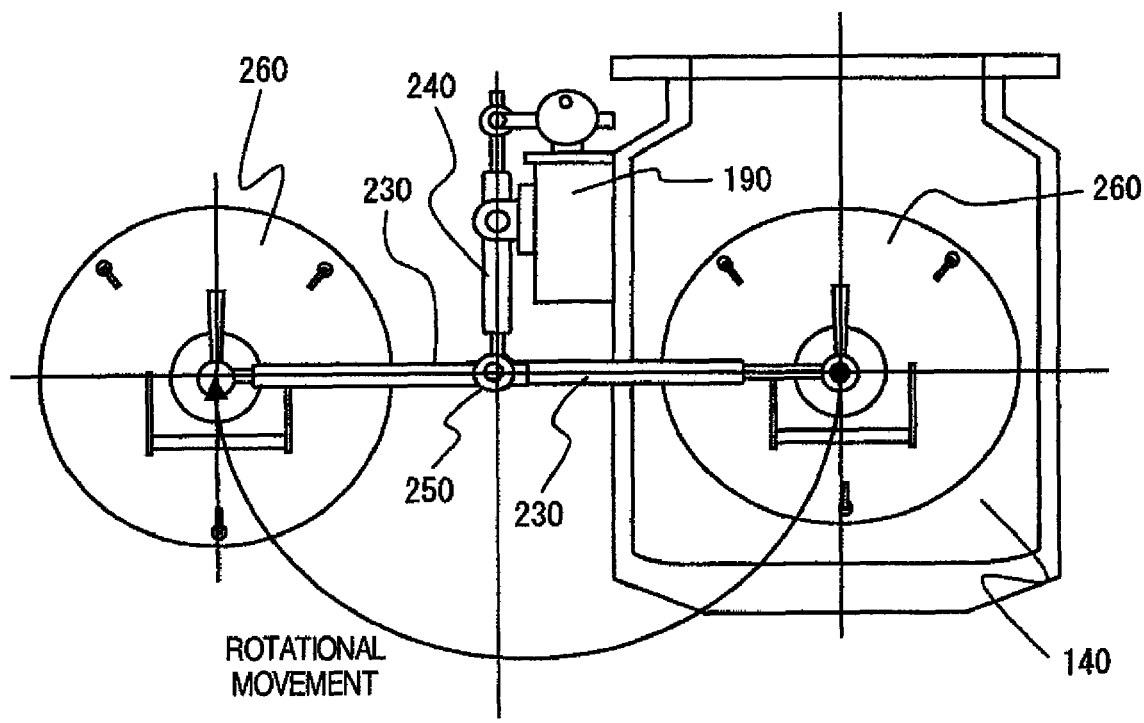
FIG. 7 is a top plan view showing the operation of the maintenance jig and the motion of the parts at the time of conducting the maintenance work on the internal parts of the vacuum vessel shown in FIG. 6.

FIG. 6 is a longitudinal sectional view for explaining the operation of the maintenance jig used for maintenance of the internal parts of the vacuum vessel according to the embodiment shown in FIG. 5. FIG. 7 is a top plan view showing the operation of the maintenance jig and the motion of the parts at the time of conducting the maintenance work on the internal parts of the vacuum vessel shown in FIG. 6. FIGS. 6 and 7 show the manner in which a chamber surrounding the vacuum container 150 at the inside of the auxiliary vacuum chamber 140 forming the vacuum container 150 is replaced.

In FIGS. 6 and 7, the vacuum processing unit 160 has two vessels, i.e. inner and outer. The vacuum container 150 in which a wafer is placed and a plasma is formed is arranged in the inner space of the vacuum vessel. The space surrounding the outer periphery of and forming the vacuum container 150 between the inner chamber and the outer vacuum vessel constitutes the auxiliary vacuum chamber 140. The lid of the vacuum vessel such as the discharge block base 520 or the vacuum vessel surrounding the inner chamber is coupled with the auxiliary vacuum chamber 140 in such a manner as to hermetically seal the space between the vacuum container 150 in the inner chamber and the auxiliary vacuum chamber 140 on the outside. In this way, the leak of the gas or the plasma in the vacuum container 150 into the auxiliary vacuum chamber 140 is suppressed. The inner chamber constituting the inner vessel of the vacuum container 150 has two parts, upper and lower, and the maintenance work is conducted on each of the inner upper chamber 610 and the inner lower chamber 620.

According to this embodiment, the inner upper chamber 610 is formed of a substantially cylindrical stainless steel member with the surface thereof electropolished. As a result, the separation of alumite which otherwise occur due to the damage or surface scar caused by the interference at the time of mounting and demounting is required to be prevented. In mounting or demounting the inner upper chamber 610 on or from the vacuum processing unit 160 according to this embodiment, the worker connects the jig head 260 to the cylindrical upper end of the inner upper chamber 610 and removes it by moving the jig head 260 upward as in the case of FIG. 5.

Further, after confirming that the lower end of the inner upper chamber 610 is taken out upward of the side wall of the vacuum vessel, the inner upper chamber 610 is rotated around a vertical axis together with the forward end side of the multijoint arm or, in this embodiment, the second joint arm unit 230 and the jig head 260, and moved into the space for the maintenance work on the outer periphery of the vacuum processing unit.

Figure 8:
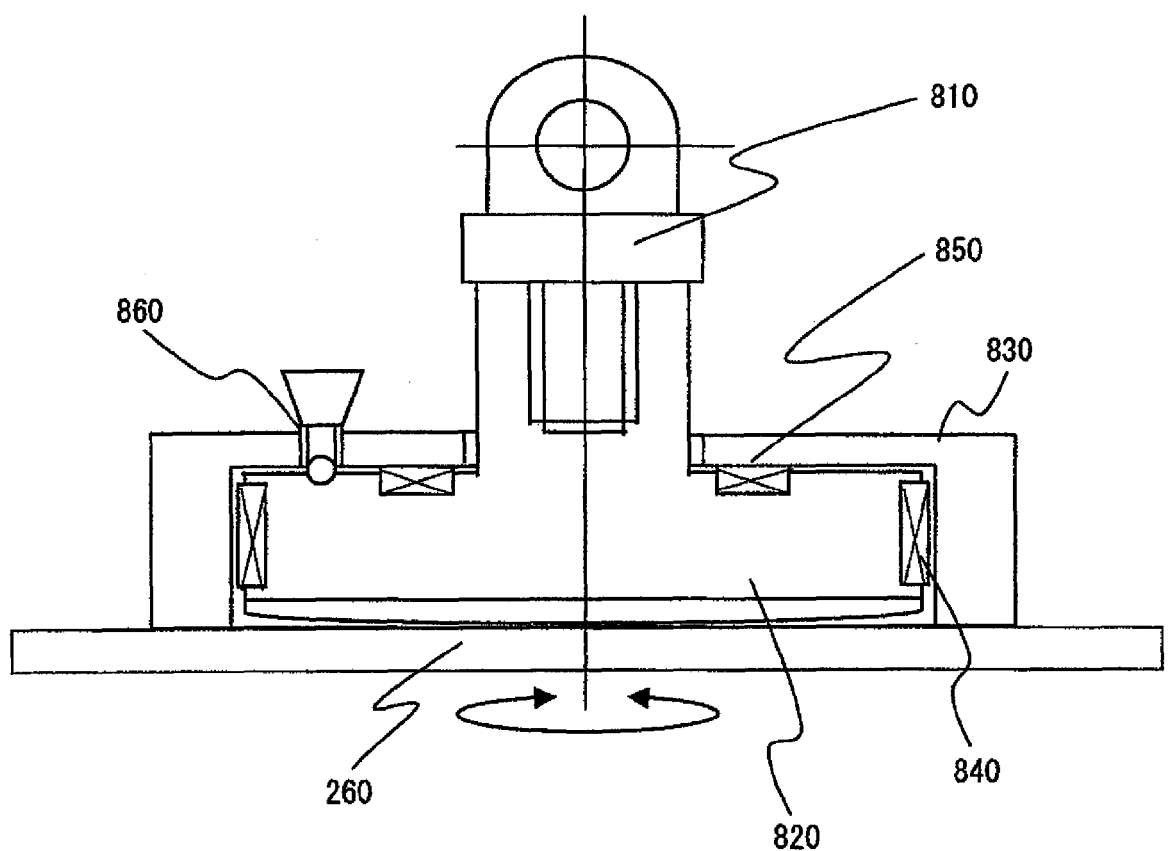
FIG. 8 is a longitudinal sectional view for explaining the configuration of the essential parts of the maintenance jig shown in FIG. 2.

FIG. 8 is a longitudinal sectional view for explaining the configuration of the essential parts of the maintenance jig shown in FIG. 2. The configuration of the portion for determining the bearing position of the jig head 260 is schematically shown in FIG. 8.

According to this embodiment, the jig head 260 is coupled to the second joint arm unit 230 by the joint portion arranged above the jig head 260. The jig head 260 is discal in shape and has the lower surface thereof in contact or coupled with the parts. The direction and the inclination of the joint portion are required to be adjustable variably to permit the contact with the other parts, the vacuum vessel or the surrounding devices in the case where the jig head 260 or the part coupled thereto is retrieved or mounted through a gap from inside the vacuum vessel. For this purpose, the bearing portion 810 making up the joint portion is required to be flexibly operated, accurately positioned and fixed. Therefore, the jig head 260 according to this embodiment has a rotary bearing 820 rotatable around the axis extending vertically through the center of the disk.

The rotary bearing 820 has a discal portion arranged in spaced relation above the jig head 260 and a cylindrical shaft portion arranged at the center thereof. The discal portion is surrounded in spaced relation by a bearing cover 830 coupled to the jig head 260. The jig head 260 is configured rotatably around the center axis of the bearing cover 830 together with the latter through the particular gap.

A thrust bearing 850 and a radial bearing 840 are arranged between the bearing cover 830 and the body of the rotary bearing 820 thereby to realize the smooth slide between the discal portion of the rotary bearing 820 and the bearing cover 830. Further, the bearing cover 830 has a rotation angle position determining mechanism 860, whereby the angle of the jig head 260 is fixed. At the time of mounting or demounting a part, therefore, the part maintenance work to mount or remove the parts can be conducted with the parts and the jig head 260 fixed at a position free of interference with the vacuum container 150 and the vacuum vessel.

Figure 9:
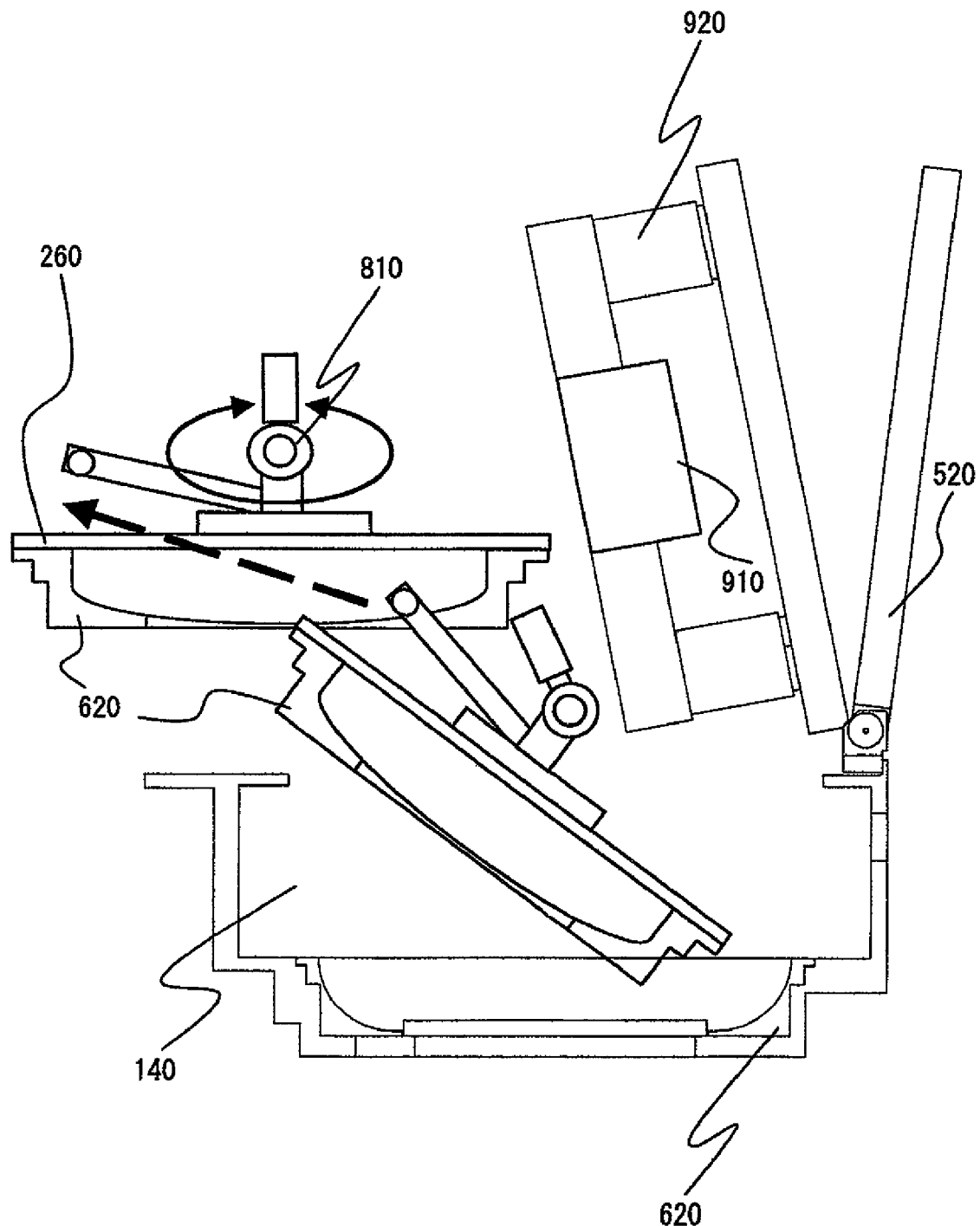
FIG. 9 is a schematic diagram showing the manner in which the internal parts of the vacuum chamber of FIG. 6 are replaced.

FIG. 9 is a schematic diagram showing the manner in which the parts in the vacuum container 150 shown in FIG. 6 are replaced. Especially, the manner is shown in which the inner lower chamber 620 forming the vacuum container 150 is replaced. In replacing the inner lower chamber 620 of the vacuum container 150, it is necessary not to damage the inner surface of an electrode sample stage 320 and an auxiliary vacuum chamber 140 by changing the posture of the inner lower chamber 620 in the internal space of the auxiliary vacuum chamber 140. Also, according to this embodiment, a sample stage 910, a suspension beam 920 and a horizontal support beam 930 for holding the sample stage 910 in the auxiliary vacuum chamber 140 in the vacuum vessel are lifted up by being rotated around a hinge at the end portion of the vacuum vessel nearer to the vacuum transfer chamber 130. Without contacting them, therefore, the parts are required to be retrieved.

According to this embodiment, while the maintenance jig 200 is lifted, the rotary bearing 370 of the jig head 260 is fixed at a predetermined angle to the horizontal surface. At the same time, by contracting the second joint arm unit 230, the maintenance jig 200 is moved out of the vacuum container 150, and after being fixed in position by the lever lock 250, revolved to conduct the replacing job in the maintenance area. Thus, the maintenance jig 200 can be retrieved free of contact.

As described above, according to this embodiment, the downtime of the apparatus can be minimized by replacing the consumables of heavy items in and out of the processing chamber using the maintenance jig. The work to replace the parts, which has conventionally been conducted by two or three workers, can now be conducted by one worker both safely and accurately. Also, the maintenance area is secured on each side of the semiconductor production equipment on the mass production line. In spite of the fact that the space in the rear of the equipment is occupied by the customer devices, the service pipes and the devices installed by other companies, therefore, the part replacing work can be conducted efficiently in the maintenance area on the side of the equipment.

According to this embodiment, the processing apparatus includes the vacuum vessel in which a plasma is formed and a sample such as a semiconductor wafer is processed, and a jig for replacing the parts in the vacuum vessel. As a result, the work of replacing a heavy item can be carried out by one worker. Also, by solving the problem thus far encountered at the time of conducting the replacing work, the downtime of the apparatus can be minimized. Also, without the extraneous service such as power and air, the load condition of the ergomotion mechanism is reduced and the efficiency of the part-replacing work is improved while at the same time retaining the delicate human manual operation.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:
1. A vacuum processing apparatus comprising:
a transfer container in which a wafer is transferred in an internal space thereof reduced in pressure;
a vacuum vessel which is coupled to a side wall of the transfer container and includes a processing chamber having therein a sample stage on which the wafer to be processed is mounted;
a lid member which opens and closes the vacuum vessel at an upper portion thereof;
an inner chamber member which is arranged in the vacuum vessel and constitutes an inner wall of the processing chamber, and
a jig which is disposed outside the vacuum vessel and is coupled to the side wall of the vacuum vessel while the wafer disposed inside the processing chamber is processed;
wherein the jig includes an extensible arm portion, a first joint portion to which the extensible arm portion is coupled and which has a vertical axis and a horizontal axis around which the extensible arm portion rotates, and a second joint portion which is arranged at a forward end of the extensible arm portion and coupled with the inner chamber member so as to be rotatable around a horizontal axis thereof, and wherein, in a state that the inside of the vacuum vessel is opened to atmosphere by opening the lid, the jig is configured to be able to move up and retrieve the inner chamber member coupled with the second joint portion from the vacuum vessel in a state that the forward end of the extensible arm portion is inserted within the vacuum vessel, wherein the inner chamber member is configured of a plurality of member units arranged above and under the sample stage, and wherein after the sample stage is lifted and retrieved by the jig above the vacuum vessel from an inside thereof, the member unit of the inner chamber member arranged under the sample stage is coupled to the jig so that the arm portion is rotated around the first joint portion and adapted to be retrieved from the vacuum vessel.

2. The vacuum processing apparatus according to claim 1, wherein a plurality of the vacuum vessels are provided in a manner of being disposed adjacently, the transfer container is polygonal in plan view and has a plurality of adjacent vacuum vessels coupled to the side wall forming the adjacent sides of the polygon of the transfer container, and wherein each of the vacuum vessels has the jig on the side wall thereof.

3. The vacuum processing apparatus according to claim 2, wherein the adjacent vacuum vessels form a space therebetween where a worker can stand and conduct the work of coupling the inner chamber member and the jig to each other.

* * * * *